US012769216B2

(12) United States Patent
Rabe et al.

(10) Patent No.: US 12,769,216 B2
(45) Date of Patent: Oct. 20, 2026

(54) PROJECTION EXPOSURE APPARATUS FOR SEMICONDUCTOR LITHOGRAPHY HAVING A CONNECTING ELEMENT

(71) Applicant: Carl Zeiss SMT GmbH, Oberkochen (DE)

(72) Inventors: Rodolfo Guglielmi Rabe, Aalen-Unterkochen (DE); Timo Speidel, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 242 days.

(21) Appl. No.: 18/426,860

(22) Filed: Jan. 30, 2024

(65) Prior Publication Data

US 2024/0168396 A1 May 23, 2024

Related U.S. Application Data

(63) Continuation of application No. PCT/EP2022/070012, filed on Jul. 18, 2022.

(30) Foreign Application Priority Data

Aug. 12, 2021 (DE) ..................... 10 2021 208 843.0

(51) Int. Cl.
*G03F 7/00* (2006.01)

(52) U.S. Cl.
CPC ................................ *G03F 7/70808* (2013.01)

(58) Field of Classification Search
CPC ... G03F 7/70808; G03F 7/709; G03F 7/70991
See application file for complete search history.

(56) References Cited

U.S. PATENT DOCUMENTS 4,852,133 A 7/1989 Ikeda et al.
6,573,978 B1 6/2003 McGuire, Jr.
2003/0048428 A1 3/2003 Kemper et al.
2006/0132747 A1 6/2006 Singer et al.
2008/0035372 A1 2/2008 Butler et al.
2010/0020525 A1 1/2010 Butler et al.
2010/0238424 A1 9/2010 Van Empel et al.
(Continued)

FOREIGN PATENT DOCUMENTS

CN 111059208 A * 4/2020 ............. G03F 7/709
DE 10 2008 009 600 A1 8/2009
(Continued)

OTHER PUBLICATIONS

International Search Report and Written Opinion for corresponding PCT Appl No. PCT/EP2022/070012, dated Jan. 23, 2023.
(Continued)

*Primary Examiner* — Peter B Kim
(74) *Attorney, Agent, or Firm* — Fish & Richardson P.C.

(57) ABSTRACT

A projection exposure apparatus for semiconductor lithography comprises a connecting element for connecting two components of the projection exposure apparatus. The connecting element comprises at least two mechanical decoupling elements, which each decouple in two mutually orthogonal rotational degrees of freedom. Overall a decoupling in all three rotational degrees of freedom is achieved by the at least two decoupling elements.

20 Claims, 5 Drawing Sheets

(56) References Cited

U.S. PATENT DOCUMENTS

| | | | |
|---|---|---|---|
| 2011/0205506 A1 | 8/2011 | Bianucci et al. |
| 2018/0023730 A1 | 1/2018 | Argersinger |
| 2018/0074303 A1 | 3/2018 | Schwab |
| 2019/0369509 A1 | 12/2019 | Peijster et al. |

FOREIGN PATENT DOCUMENTS

| | | | | |
|---|---|---|---|---|
| DE | 10 2016 217 285 A1 | | 3/2018 | |
| DE | 10 2019 200 388 A1 | | 3/2019 | |
| DE | 10 2017 220 586 A1 | | 5/2019 | |
| EP | 1614008 B1 | | 12/2009 | |
| WO | WO-2018097729 A1 | * | 5/2018 | ......... E05D 11/0081 |

OTHER PUBLICATIONS

German Office Action, with translation thereof, for corresponding DE Appl No. 10 2021 208 843.0, dated Jan. 27, 2022.

Office Action in Taiwanese Appln. No. 111130293, mailed on Apr. 21, 2026, 9 pages (with English translation).

Search Report in Taiwanese Appln. No. 111130293, mailed on Apr. 22, 2026, 7 pages (with English translation).

* cited by examiner

PROJECTION EXPOSURE APPARATUS FOR SEMICONDUCTOR LITHOGRAPHY HAVING A CONNECTING ELEMENT

CROSS-REFERENCE TO RELATED APPLICATIONS

The present application is a continuation of, and claims benefit under 35 USC 120 to, international application PCT/EP2022/070012, filed Jul. 18, 2022, which claims benefit under 35 USC 119 of German Application No. 10 2021 208 843.0, filed Aug. 12, 2021. The entire disclosure of each these applications is incorporated by reference herein.

FIELD

The disclosure relates to a projection exposure apparatus for semiconductor lithography having a connecting element.

BACKGROUND

Connecting elements are used to exchange energy, signals and fluids between at least two components of a projection exposure apparatus of semiconductor technology. It is possible here for one of the two components to be embodied in the form of an optical element, such as a mirror, of the projection exposure apparatus, which can be positioned in at least three degrees of freedom for optimizing the imaging quality. Connecting elements having lines and optical waveguides can comprise a protective apparatus which protects them against mechanical damage for example during the installation and transport of the projection exposure apparatus.

The connecting elements constitute a mechanical connection between the components that can also transmit undesirable mechanical vibrations. For this reason, the connecting elements are typically embodied such that only minimal static and dynamic forces can be transmitted from one component to a component connected thereto, that is to say the components are maximally decoupled from one another.

The static force is brought about by a static stiffness of the connecting element and a deflection of the two components with respect to one another and defines the force that stems from the deformation of the connecting element and its stiffness, or its elastic properties, and that acts on the components in the case of a relative movement between the two components.

Like the dynamic stiffness, the dynamic force is frequency-dependent and is determined by the transmission properties of the connecting element at different frequencies, for example the natural frequency, of the connecting element. For example, the mass of the connecting element can have an effect on the transmission properties of the connecting element and thus on the transmitted dynamic force at a determined frequency of a relative oscillation of the two components with respect to one another. The forces that are exerted as a result by the connecting element over a frequency range, and thus the movements, influence the controllability of the component to be positioned and can result in unstable control.

Certain known connecting elements in connection with lines and optical waveguides are embodied for example in the form of corrugated tubes made of steel, which are arranged in an arc between two components or subsystems and which receive the lines or optical waveguides. The corrugated tubes offer sufficient mechanical protection for the lines and optical waveguides and with a corresponding design can also safeguard against a bend radius falling below the minimum bend radius such as of optical waveguides.

However, the described corrugated tubes can have a static and dynamic stiffness that is too great for the increased desired properties in the latest generations of projection exposure apparatuses. Alternative plastic tubes that are sufficiently static and dynamically stiff have a tendency to outgas excessively and/or do not offer protection with respect to the bend radius being too low. They therefore might offer merely limited suitability for use in a projection exposure apparatus.

When plastic tubes are used for fluids, permeation may occur as well, which can be undesirable, for example for projection exposure apparatuses operated in vacuum.

German patent application DE 10 2019 200 388 A1 discloses a protective apparatus for lines for semiconductor lithography, which comprises at least one bushing between at least two partial elements of the protective apparatus. The bushing comprises a region made of an elastic material with inherent damping, such as for example perfluoroelastomer. The stiffness and the damping of the bushing are proportional to one another, with the result that only either the stiffness or the damping of the protective apparatus can be optimized.

SUMMARY

The present disclosure seeks to provide an apparatus that resolves issued described above. The present disclosure also seeks to provide an improved method for optimizing the decoupling of the connecting element with respect to stiffness and damping.

According to an aspect of the disclosure, a projection exposure apparatus for semiconductor lithography comprises a connecting element for connecting two components of the projection exposure apparatus and at least one mechanical decoupling element. According to the disclosure, the connecting element comprises at least two mechanical decoupling elements, which each decouple in two mutually orthogonal rotational degrees of freedom, wherein overall a decoupling in all three rotational degrees of freedom is achieved by the at least two decoupling elements.

A connecting element is here in particular to be understood to mean an element with which a mechanical connection between the two components is established. For example, the connecting element can be, for example, a tubular protection for electrical or optical lines, but also a line for a temperature-regulating fluid.

The components can be, for example, a mirror and a structural component of the projection exposure apparatus, such as a part of the support structure of the projection exposure apparatus, e.g., the force frame, as it is known. Decoupling in two rotational degrees of freedom can be achieved for example by the respective decoupling element being embodied so as to be readily actuable about two mutually orthogonal axes. The targeted decoupling in all three rotational degrees of freedom can here be achieved for example by the at least two decoupling elements being connected via at least one angled partial element in a manner such that the third rotational degree of freedom for the entire connecting element arises by way of the rotated orientation of the two decoupling elements. In this way, improved mechanical decoupling can be achieved even if the installation space is limited.

The at least one angled partial element can here be angled at an angle in the range between 85° and 95°, such as at 90°.

The at least one decoupling element can be embodied, for example, in the form of a flexure or of a bellows. The decoupling element being embodied in the form of a bellows means that decoupling about any desired rotation axis in a plane orthogonal to the axial direction of the bellows is possible. The axial direction of the bellows is understood to mean the direction of the cylinder longitudinal axis of a bellows that has a hollow cylindrical basic form.

According to a further aspect, a projection exposure apparatus for semiconductor lithography comprises a connecting element for connecting two components of the projection exposure apparatus and at least one mechanical decoupling element. According to the disclosure, at least one partial element of the connecting element is in this case provided with an additional mass in a manner such that the second of the two components is shielded against a mechanical excitation coming from the first component.

An additional mass is here understood to mean a mass component of the respective element that is not required for reasons of mechanical stability, such as for reasons of stiffness. For example, the additional mass can be realized by the element having a more solid design than is needed for stability or stiffness reasons. For example, a tubular element can be designed with a greater wall thickness than would be needed for static reasons. Alternatively, the additional mass can also be in the form of a separate, additional and possibly removable or interchangeable mass. The inertia associated with the additional mass of the at least one partial element can result for example in high-frequency excitations being transmitted to a diminished extent via the partial element. The inertia here can mean that the connecting element deforms instead of passing on the excitation.

Due to the fact that the connecting element comprises at least one damper for dissipating the kinetic energy of the mechanical excitation, it is possible to ensure effective shielding of the second component. For example, the mechanical decoupling element can be provided with the at least one damper.

The partial element can be, for example, an angled partial element; furthermore, the first component can be part of a frame of the projection exposure apparatus, and the second component can be an optical element.

According to another aspect, the disclosure provides a projection exposure apparatus for semiconductor lithography comprising a connecting element for connecting two components of the projection exposure apparatus and at least one mechanical decoupling element, wherein the at least one decoupling element is provided with at least one additional damper, which is deformed when the decoupling element is actuated.

By using a damper as a separate element assigned to a decoupling element, the properties of the decoupling element with respect to stiffness and damping can be adapted to the respective desired properties.

The at least one damper can be connected mechanically both to a first and a second partial element, which themselves are connected to each other via the decoupling element.

For example, the at least one damper can be embodied in the form of a cylindrical element and be arranged such that it is deformed vertically to its cylinder longitudinal axis when the decoupling element is actuated.

Furthermore, the at least one damper can be embodied in the form of a hollow-cylindrical element and be arranged such that it is deformed at least in certain regions in its axial direction when the decoupling element is actuated.

An alternative variant of a projection exposure apparatus for semiconductor lithography comprises a connecting element for connecting two components of the projection exposure apparatus to a first and second partial element and at least one mechanical decoupling element arranged between the first and second partial elements. According to the disclosure, the first and second partial elements are connected to one another via a respective frame element, wherein the frame elements are embodied in a manner such that a maximum actuation of the decoupling element is limited by at least one end stop.

Here, the at least one frame element can be embodied in the form of a U-shaped element, and at least one further frame element can be embodied in the form of an L-shaped element, wherein one side of the L-shaped frame element is arranged inside the recess formed by the U-shaped frame element.

In a variant of the disclosure, the frame elements can be formed identically and comprise a hollow-cylindrical main body, with axial extensions and radial extensions being arranged in alternation around the circumferential side of the main body, wherein in each case one radial extension and one axial extension lie opposite one another. The axial extensions are here oriented to align with the respective radial extension, and the radial extensions are provided in each case with a cutout through which a respective screw extends that is screwed at the end face into the opposite axial extension.

An axial extension is here understood to mean an extension at the main body that extends primarily in the axial direction of the main body. Accordingly, a radial extension is understood to mean an extension at the main body that extends primarily in the radial direction of the main body.

Exemplary embodiments and variants of the disclosure are explained in greater detail below with reference to the drawing.

DETAILED DESCRIPTION

Figure 1:
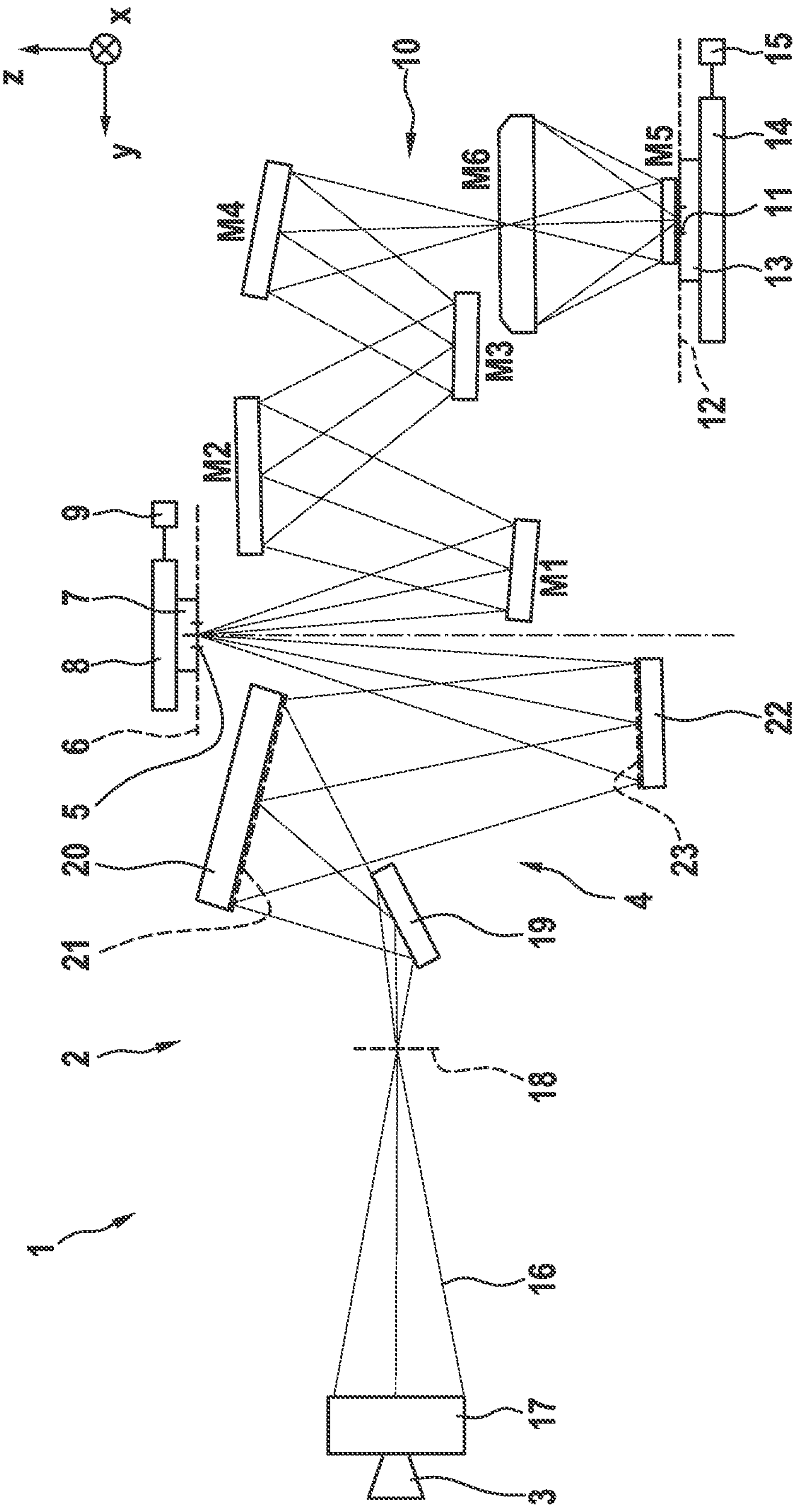
FIG. 1 schematically shows a meridional section of a projection exposure apparatus for EUV projection lithography.

In the following text, certain components of a microlithographic projection exposure apparatus 1 are described first by way of example with reference to FIG. 1. The description of the fundamental construction of the projection exposure apparatus 1 and the integral parts thereof is understood here to be non-limiting.

One embodiment of an illumination system 2 of the projection exposure apparatus 1 has, in addition to a radiation source 3, an illumination optical unit 4 for illuminating an object field 5 in an object plane 6. In an alternative embodiment, the light source 3 can also be provided as a module separate from the rest of the illumination system. In this case, the illumination system does not comprise the light source 3.

A reticle 7 arranged in the object field 5 is exposed. The reticle 7 is held by a reticle holder 8. The reticle holder 8 is displaceable by way of a reticle displacement drive 9, in particular in a scanning direction.

A Cartesian xyz-coordinate system is shown in FIG. 1 for explanation purposes. The x-direction runs perpendicular to the plane of the drawing into the latter. The y-direction runs horizontally and the z-direction runs vertically. The scanning direction runs along the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 runs parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, in particular along the y-direction. The displacement, firstly, of the reticle 7 by way of the reticle displacement drive 9 and, secondly, of the wafer 13 by way of the wafer displacement drive 15 can be implemented so as to be synchronized with one another.

The radiation source 3 is an EUV radiation source. The radiation source 3 emits, in particular, EUV radiation 16, which is also referred to below as used radiation, illumination radiation or illumination light. In particular, the used radiation has a wavelength in the range of between 5 nm and 30 nm. The radiation source 3 can be a plasma source, for example an LPP (laser produced plasma) source or a GDPP (gas discharge produced plasma) source. It can also be a synchrotron-based radiation source. The radiation source 3 can be a free electron laser (FEL).

The illumination radiation 16 emerging from the radiation source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 can be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. FIG. 1 depicts only some of the facets 21 by way of example.

The first facets 21 can be in the form of macroscopic facets, such as in the form of rectangular facets or in the form of facets with an arcuate peripheral contour or a peripheral contour of part of a circle. The first facets 21 may be in the form of plane facets or alternatively in the form of convexly or concavely curved facets.

As known for example from DE 10 2008 009 600 A1, the first facets 21 themselves may also be composed in each case of a multiplicity of individual mirrors, for example a multiplicity of micromirrors. The first facet mirror 20 can be formed as a microelectromechanical system (MEMS system). For details, reference is made to DE 10 2008 009 600 A1.

The illumination radiation 16 travels horizontally, that is to say along the y-direction, between the collector 17 and the deflection mirror 19.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can for example have a round, rectangular or hexagonal periphery, or can alternatively be facets made up of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This fundamental principle is also referred to as a fly's eye condenser (fly's eye integrator). It can be desirable to arrange the second facet mirror 22 not exactly in a plane that is optically conjugate to a pupil plane of the projection optical unit 10. For example, the pupil facet mirror 22 can be arranged so as to be tilted relative to a pupil plane of the projection optical unit 10, as is described, for example, in DE 10 2017 220 586 A1.

The individual first facets 21 are imaged into the object field 5 with the aid of the second facet mirror 22. The second facet mirror 22 is the last beam-shaping mirror or else, in fact, the last mirror for the illumination radiation 16 in the beam path upstream of the object field 5.

In a further embodiment, not shown, of the illumination optical unit 4, a transfer optical unit contributing for example to the imaging of the first facets 21 into the object field 5 can be arranged in the beam path between the second facet mirror 22 and the object field 5. The transfer optical unit can have exactly one mirror or alternatively have two or more mirrors, which are arranged one behind the other in the beam path of the illumination optical unit 4. The transfer optical unit can comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the pupil facet mirror 22.

The deflection mirror 19 can also be dispensed with in a further embodiment of the illumination optical unit 4, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection optical unit 10 is a double-obscured optical unit. The projection optical unit 10 has an image-side numerical aperture which is greater than 0.5 and which can also be greater than 0.6 and, for example, be 0.7 or 0.75.

Reflection surfaces of the mirrors Mi can be embodied as free-form surfaces without an axis of rotational symmetry. Alternatively, the reflection surfaces of the mirrors Mi can be designed as aspheric surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, such as with alternating layers of molybdenum and silicon.

The projection optical unit 10 has a large object-image offset in the y-direction between a y-coordinate of a centre of the object field 5 and a y-coordinate of the centre of the image field 11. This object-image offset in the y-direction can be of approximately the same magnitude as a z-distance between the object plane 6 and the image plane 12.

For example, the projection optical unit 10 can have an anamorphic embodiment. For example, it has different imaging scales $\beta x$, $\beta y$ in the x- and y-directions. The two imaging scales $\beta x$, $\beta y$ of the projection optical unit 10 can be ($\beta x$, $\beta y$)=(+/−0.25, +/−0.125). A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units with different numbers of such intermediate images in the x- and y-directions are known from US 2018/0074303 A1.

In each case one of the pupil facets 23 is assigned to exactly one of the field facets 21 for forming in each case an illumination channel for illuminating the object field 5. For example, this can yield illumination according to the Köhler principle. The far field is decomposed into a multiplicity of object fields 5 with the aid of the field facets 21. The field facets 21 produce a plurality of images of the intermediate focus on the pupil facets 23 respectively assigned thereto.

By way of a respectively assigned pupil facet 23, the field facets 21 are imaged onto the reticle 7 in a manner superposed on one another for the purposes of illuminating the object field 5. The illumination of the object field 5 can be as homogeneous as possible. It can have a uniformity error of less than 2%. The field uniformity can be achieved by way of the superposition of different illumination channels.

The illumination of the entrance pupil of the projection optical unit 10 can be defined geometrically by way of an arrangement of the pupil facets. The intensity distribution in the entrance pupil of the projection optical unit 10 can be set by selecting the illumination channels, such as the subset of the pupil facets which guide light. This intensity distribution is also referred to as illumination setting.

A likewise preferred pupil uniformity in the region of sections of an illumination pupil of the illumination optical unit 4 which are illuminated in a defined manner can be achieved by a redistribution of the illumination channels.

Further aspects and details of the illumination of the object field 5 and of the entrance pupil of the projection optical unit 10 are described below.

For example, the projection optical unit 10 can have a homocentric entrance pupil. The latter can be accessible. It can also be inaccessible.

The entrance pupil of the projection optical unit 10 cannot regularly be exactly illuminated using the pupil facet mirror 22. In the case of imaging of the projection optical unit 10 which telecentrically images the centre of the pupil facet mirror 22 onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different positions of the entrance pupil for the tangential beam path and for the sagittal beam path. In this case, an imaging element, such as an optical component element of the transfer optical unit, should be provided between the second facet mirror 22 and the reticle 7. With the aid of this optical element, the different positions of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged in tilted fashion with respect to the object plane 6. The first facet mirror 20 is arranged in tilted fashion with respect to an arrangement plane defined by the deflection mirror 19.

The first facet mirror 20 is arranged in tilted fashion with respect to an arrangement plane defined by the second facet mirror 22.

Figure 2A:
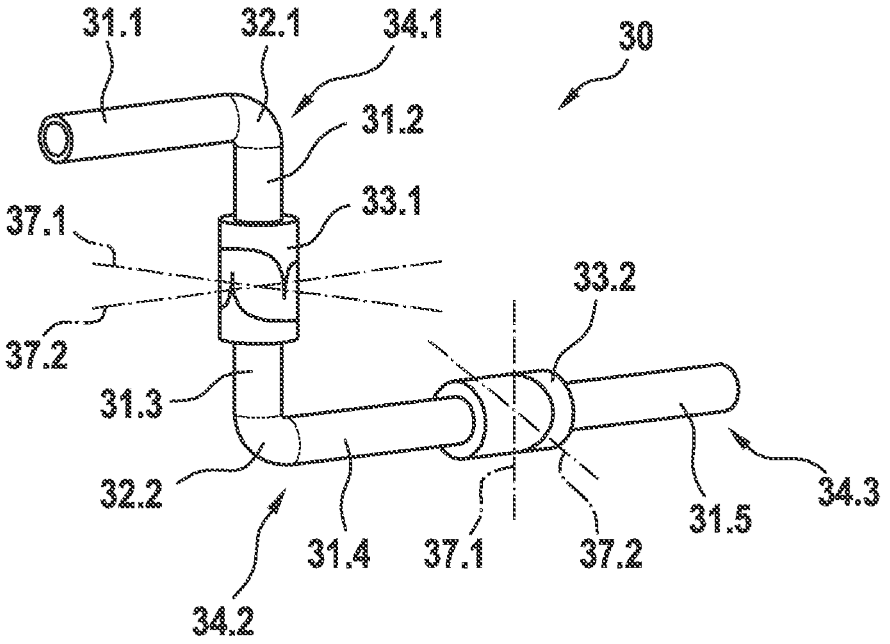
FIGS. 2A,2B show a schematic illustration of a connecting element according to the disclosure.

FIG. 2A shows a schematic illustration of a first embodiment of a connecting element according to the disclosure, which comprises a plurality of partial elements 31, 32 and two decoupling elements 33. The connecting element 30 can connect for example a mirror M1-M6 described in FIG. 1 to a frame (not illustrated in FIG. 1) of the projection exposure apparatus 1. The connecting element 30 can enclose lines for signal transmission as mechanical protection or be embodied in the form of a line for a fluid for regulating the temperature of the mirror. The partial elements 31 and 32 are for example tubular and comprise, for example, metal or plastic, such as polytetrafluoroethylene (PTFE) or terpolymer of tetrafluoroethylene, hexafluoropropylene and vinylidene fluoride (THV).

A first section 34.1 comprises a straight partial element 31.1, a partial element 32.1 that is angled at 90° and again a straight partial element 31.2, which is connected to a first decoupling element 33.1. The decoupling element 33.1 is connected to a second section 34.2 of the connecting element 30, which likewise comprises a straight partial element 31.3, a partial element 32.2 that is angled at 90° and again a straight partial element 31.4, wherein the 90° angle of the one angled partial element 32.2 is embodied to extend in the opposite direction to the angle of the other angled partial element 32.1 in the first section 34.1. In other words, the two angled partial elements 32.1 and 32.2 are rotated with respect to one another by 180° in their common plane. Therefore, the first straight partial element 31.1 of the first section 34.1 and the second straight partial element 31.4 of the second section 34.2 are parallel to each other. A second decoupling element 33.2 connects the second section 34.2 to a third section 34.3 of the connecting element 30, which comprises only one straight partial element 31.5. The decoupling elements 33.1, 33.2 are embodied such that they decouple in each case in at least two mutually orthogonal rotational degrees of freedom, in other words have a significantly lower stiffness than in the other four degrees of freedom.

To this end, the decoupling elements 33.1 and 33.2 in the example shown are embodied in the form of monolithic universal joints. The monolithic universal joints 33.1, 33.2 are actuable here by two intersecting mutually orthogonal rotation axes 37.1, 37.2. By way of the two universal joints 33.1, 33.2, the straight partial element 31.1 in the first section 34.1 of the connecting element 30 is decoupled with respect to the straight partial element 31.5 in the third section 34.3 of the connecting element 30 in all six degrees of freedom. The static and dynamic stiffness of the different decoupling directions can be optimized by designing the universal joints 33.1, 33.2 for the respective application. The position of the universal joints 33.1, 33.2 or the length and division of the sections 34.1, 34.2, 34.3 are likewise incorporated in the design.

The arrangement shown in FIG. 2A can be suitable for providing for example signal or electrical supply lines with a mechanical protection or for providing an electromagnetic shield using the connecting element 30. Due to the fact that the tasks “mechanical protection” and/or “electromagnetic shield” are adopted at least partially by the connecting element 30, further possibilities are opened up in the selection/design of the lines and thus the lines generally also contribute less to the overall stiffness of the connection. Overall, the arrangement shown makes it possible to achieve sufficient mechanical decoupling of the connected components with shorter connecting elements than known from the prior art.

Figure 2B:
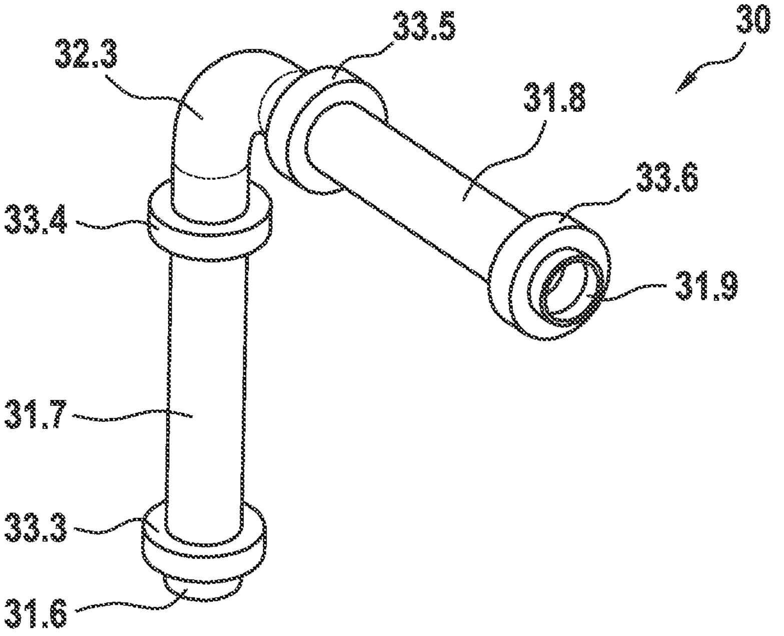

FIG. 2B shows a further embodiment of a connecting element 30 according to the disclosure, in which four decoupling elements in the form of bellows 33.3, 33.4, 33.5, 33.6 are illustrated. A first partial element in the form of a tube 31.6 is followed by a first bellows 33.3; a further tube 31.7 connects this first bellows 33.3 to a second bellows 33.4, which in turn is connected to an angle piece 32.3. Arranged to be connected to the angle piece 32.3 is a third bellows 33.5, which is connected to the fourth bellows 33.6 via a further tube 31.8. A tube 31.9 connected to the fourth bellows 33.6 terminates the connecting element 30. The bellows 33 comprise stainless steel or nickel, wherein a nickel bellows can have a wall thickness of a few 10 μm, as a result of which a very low stiffness of the bellows 33 can be obtained. The stiffness of the bellows 33 is directly involved in the transmission of the force between the components connected via the connecting element 30.

The decoupling via the bellows 33 is mainly based on tilting of the two tubes 31 or angle pieces 32, which are connected to the respective bellows 33, with respect to one another and an elongation/compression of the bellows 33. By comparison, the rotation about the bellows longitudinal axis and a shift of the two connected tubes 31 perpendicular to the bellows longitudinal axis are very stiff and play a minor role in the decoupling effect. As has already been explained analogously in FIG. 2A, the static and dynamic properties of the connecting element 30 can be adapted optimally to the desired properties due to the position of the bellows 33 and the design thereof. For example, a specific first natural frequency of the connecting element 30 can be set such that control of the component which is embodied for example in the form of an optical element is not negatively influenced.

The decoupling elements 33 which are embodied in the form of universal joints and bellows and also the partial elements which are embodied in the form of tubes 31 and angle pieces 32 have no or nearly no damping, with the result that additional dampers are desirable for damping the connecting element 30.

Figure 3A:
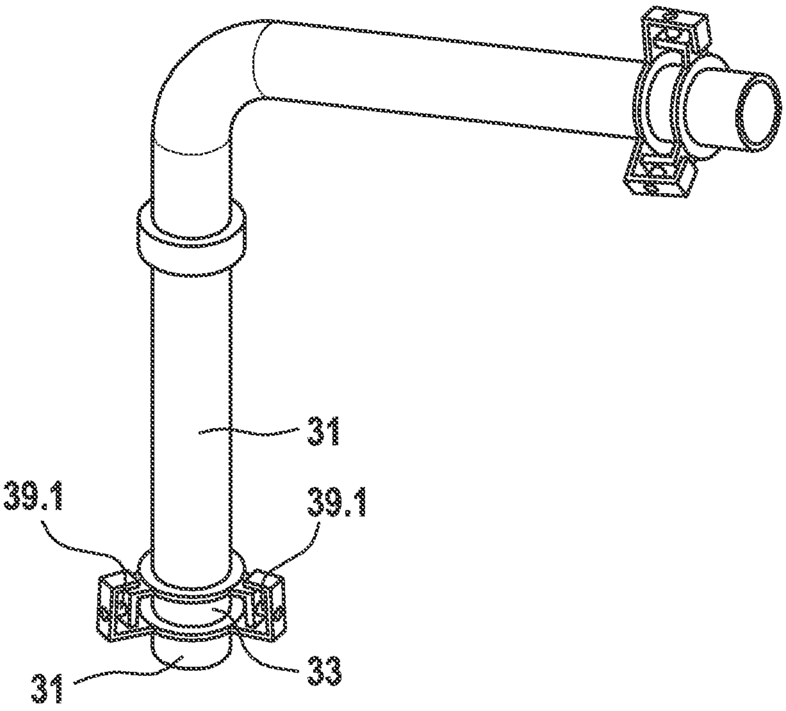
FIGS. 3A,3B show first and second embodiments of a connecting element according to the disclosure.
Figure 3B:
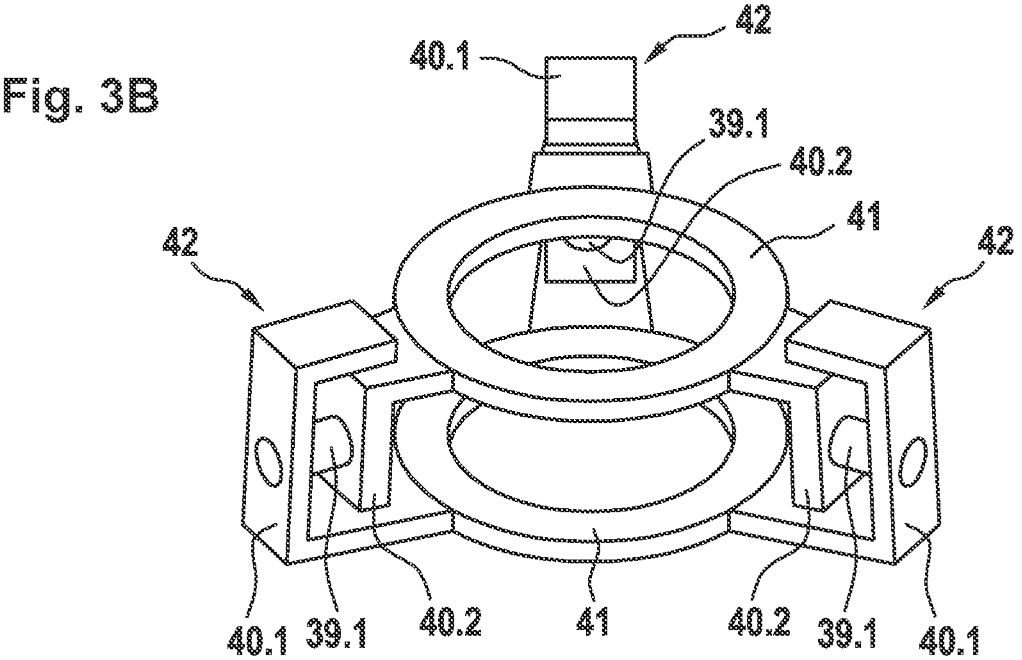

A first embodiment of a decoupling element 33 having a damper 39.1 is illustrated in FIGS. 3A and 3B, wherein FIG. 3B is a detail view of FIG. 3A. The partial elements 31 respectively connected to the bellows 33 hold, via a receptacle 41, in each case one frame element 40.1 and 40.2, respectively, wherein dampers 39.1 are arranged between the frame elements 40.1 and 40.2. The frame elements 40.1, 40.2 and the dampers 39.1 are arranged here such that tilting of the bellows 33 about a rotation axis that runs perpendicular to an imaginary axis through the dampers 39.1 and the elongation/compression of the bellows 33 are damped. The dampers 39.1 are embodied in the example shown in the form of substantially cylindrical elements, for example made from FKM/FFKM. The damping occurs here owing to the deformation of the dampers 39.1 and a dissipation of energy consequently occurring in the damper 39.1. The frame elements 40.1, 40.2 are additionally embodied such that the maximum elongation/compression and the maximum angle of the tilt of the bellows 33 are limited by end stops 42, as a result of which damage to the bellows 33 can be avoided. To this end, the frame elements 40.1 in the example shown are embodied in the form of U-shaped elements. The frame elements 40.2 are embodied in the form of L-shaped elements, wherein one side of the frame elements 40.2 is arranged inside the recess formed by the frame element 40.1, whereby a movement of the frame element 40.2 is limited. For example, a harmful deformation, such as an undesirable elongation of the bellows 33 due to an overpressure occurring in the system, can be avoided. The design of the dampers 39.1, shown in the figure, in the form of local individual elements arranged at discrete locations around the bellows here allows the deliberate selection of the modes to be damped. In this way it is possible to achieve a good compromise between the damping effect attained and the additional stiffness of the connecting element 30 associated with the use of the dampers 39.1.

Figure 4:
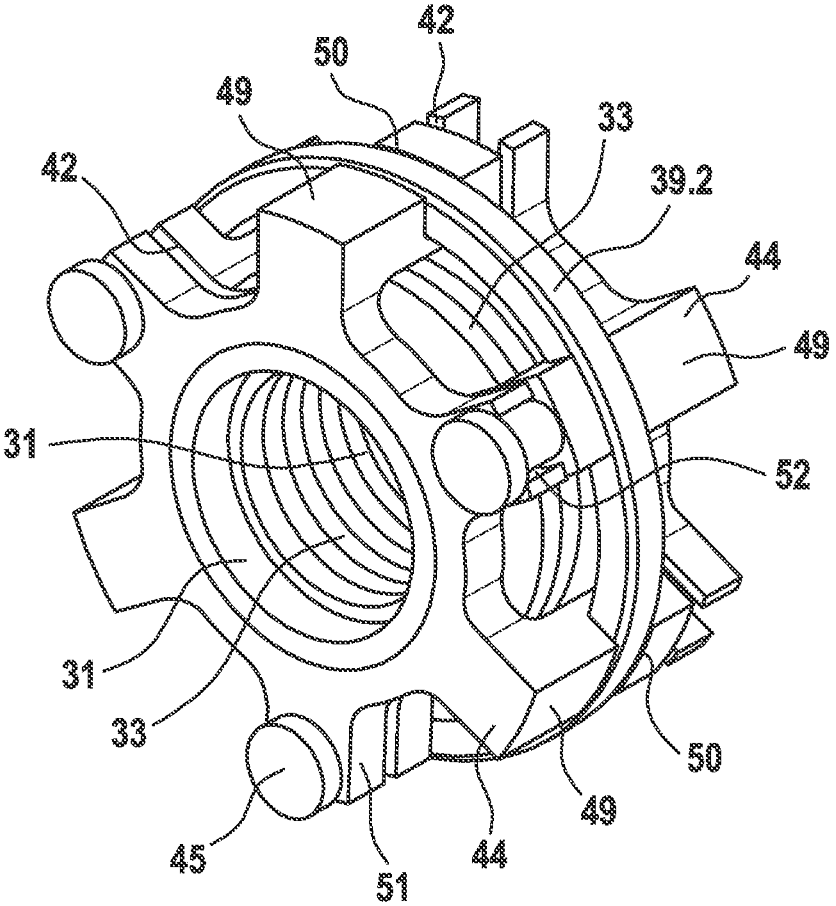
FIG. 4 shows a detail view concerning an embodiment of the disclosure.

A second embodiment of a decoupling element 33 with a damper embodied in the form of a hollow-cylindrical element (an O-ring in the example shown) is illustrated in FIG. 4. Frame elements 44, which together receive the O-ring 39.2, are respectively arranged at the partial elements 31 connected to the bellows 33. In addition to the tilting of the bellows 33 about all rotation axes oriented perpendicular to the longitudinal axis of the bellows 33, the O-ring also damps an elongation/compression of the bellows 33. Like in the embodiment described in FIG. 3, the frame elements 44 are arranged relative to one another in a manner such that the tilting and elongation/compression of the bellows 33 is limited by end stops 42. The end stop can be set by connecting the two frame elements 44 using three screws 45.

The frame elements 44 are in this case formed substantially identically and comprise a hollow-cylindrical main body, with axial extensions 49 and radial extensions 51 being disposed in the example shown in alternation around the circumferential side of the main body at an angular spacing of 60 degrees. It goes without saying that other arrangements are also conceivable. The two frame elements 44 are arranged here around the bellows 33 in a manner such that in each case one radial extension 51 and one axial extension 49 lie opposite each other. The axial extensions 49 extend axially from the respective frame element 44 in the direction of the opposite other frame element 44 and are oriented so as to align with the respective radial extension 51. The axial extensions 49 furthermore have a receiving groove 50, which runs parallel to the circumferential direction of the bellows 33 and in which the O-ring 39.2, which is formed from an elastic material, is placed around the bellows 33. When the bellows 33 are actuated, the O-ring 39.2 is deformed in certain sections in the axial direction. The radial extensions 51 are provided each with a cutout 52, through which a respective screw 45 extends. The screw 45 is screwed at the end face into the axial extension 49 of the frame element 44 that lies opposite the relevant frame element 44. Through the interaction of the screw head, the cutout and the two extensions, it is possible in this way to implement an end stop 42 which acts in both directions.

Figure 5:
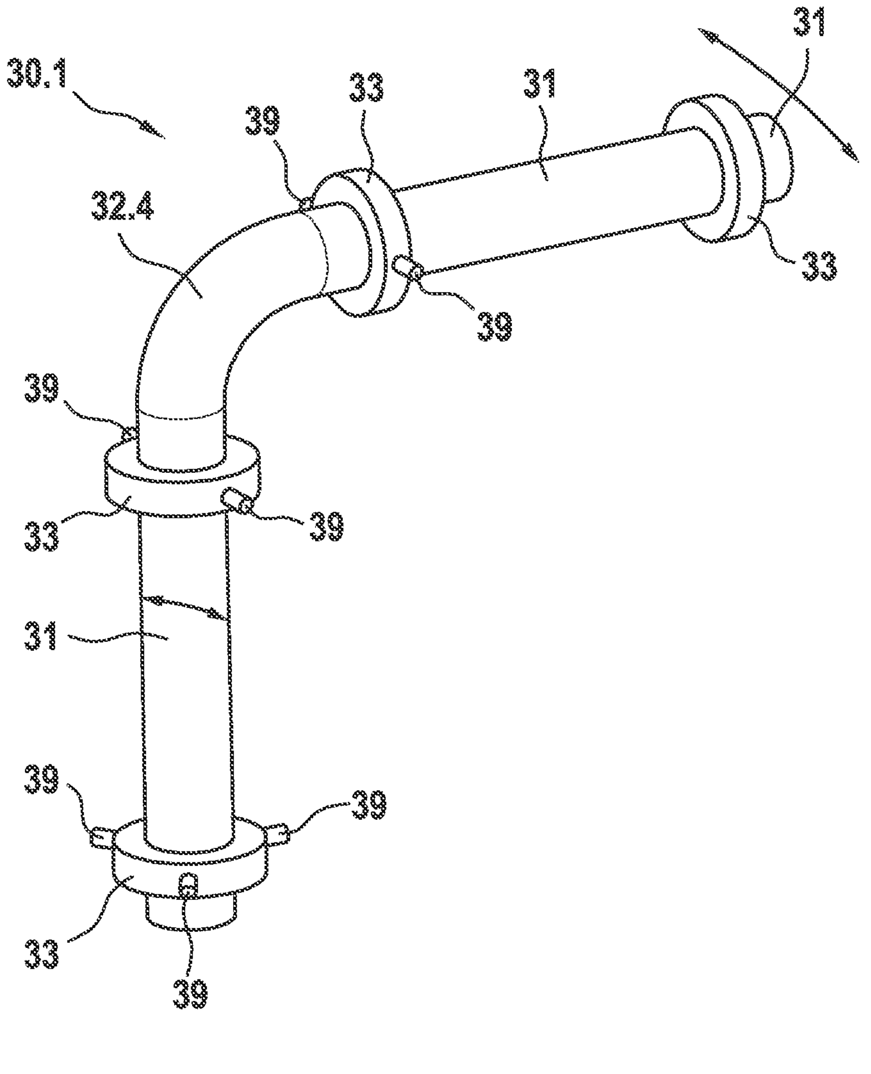
FIG. 5 shows an embodiment of a connecting element according to the disclosure.

FIG. 5 shows a further embodiment of a connecting element 30.1, which is embodied in the form of a tuned mass damper. The latter comprises the angled partial element 32.4, which is used as the absorber mass, and, connected thereto and damped thereby, the bellows 33, wherein the frame elements 40 are not illustrated for reasons of clarity. If a partial element 31 of the connecting element 30.1 is excited, as is illustrated by way of example using a double-headed arrow in FIG. 5, the energy thus introduced is dissipated by the oscillation of the partial element 32.4 between the two bellows 33 and 33 and the resulting tilt by the dampers 39. The movement of the partial element 31 that is arranged on the other side of the angled partial element 32.4 is thereby clearly decoupled with respect to the movement introduced into the connecting element 30.1, that is to say lower, which is illustrated by the smaller double-headed arrow. The natural frequency of the tuned mass damper 30.1 is typically designed such that a control of an optical element connected thereto is not negatively influenced. The tuned mass damper 30.1 greatly damps movements above its natural frequency, with the result that even excitations of higher frequencies have no negative effects. The damping of the bellows 33 can be individually adapted to the desired properties. In the embodiment shown in FIG. 5, two bellows 33 are damped in only one direction, whilst the third bellows 33 is damped in all tilt directions by the three dampers 39. A damper 39 also always introduces an additional stiffness into the system, which results in a greater force for moving the components relative to one another. These two parameters need to be optimized when designing the decoupling in order to meet the predetermined desired decoupling. This can mean that the amount of damping material in the system can be reduced, thereby reducing possible contamination sources.

LIST OF REFERENCE SIGNS

1 Projection exposure apparatus
2 Illumination system
3 Radiation source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 EUV radiation
17 Collector
18 Intermediate focal plane
19 Deflection mirror
20 Facet mirror
21 Facets
22 Facet mirror
23 Facets
30, 30.1 Connecting element, tuned mass damper
31.1, 31.2 Straight partial element
32.1-32.3 Angled partial element
33, 33.1, 33.2 Decoupling element, bellows
34.1-34.4 Tube
37.1, 37.2 Rotation axis joint
39, 39.1, 39.2 Damper, O-ring
40, 40.1, 40.2 Frame element
41 Receptacle
42 End stop
44 Frame element
45 Screw
49 Axial extension
50 Receiving groove
51 Radial extension
52 Cutout

What is claimed is:

1. An apparatus, comprising:

a connecting element configured to connect two components of the apparatus, the connecting element comprising first and second partial elements and a mechanical decoupling element between the first and second partial elements;

a first frame element; and a second frame element;

wherein:

the first and second frame elements connect the first and second partial elements;

the first and second frame elements are configured to engage one another and are movable relative to one another over a limited distance, thereby defining a stop so that actuation of the decoupling element is limited by the stop; and the apparatus is a semiconductor lithography projection exposure apparatus.

2. The apparatus of claim 1, wherein the first frame element is U-shaped.

3. The apparatus of claim 2, wherein the second frame element is L-shaped.

4. The apparatus of claim 1, wherein:

the first frame element is U-shaped;

the second frame element is L-shaped; and a side of the L-shaped frame element is inside a recess defined by the U-shaped frame element.

5. The apparatus of claim 1, wherein the first and second frame elements are identical.

6. The apparatus of claim 5, wherein each of the first and second frame elements comprises a hollow-cylindrical main body comprising axial extensions and radial extensions alternating around a circumferential side of the main body.

7. The apparatus of claim 6, wherein, for each of the first and second frame elements, a radial extension and an axial extension lie opposite each other.

8. The apparatus of claim 7, wherein the axial extensions are aligned with the respective radial extension.

9. The apparatus of claim 8, wherein the radial extensions comprise a cutout through which a respective screw extends that is screwed at an end face into the opposite axial extension.

10. The apparatus of claim 1, wherein each of the first and second frame elements comprises a hollow-cylindrical main body comprising axial extensions and radial extensions alternating around a circumferential side of the main body.

11. The apparatus of claim 10, wherein, in each case, a radial extension and an axial extension lie opposite each other.

12. The apparatus of claim 11, wherein the axial extensions are aligned with the respective radial extension.

13. The apparatus of claim 12, wherein the radial extensions comprise a cutout through which a respective screw extends that is screwed at an end face into the opposite axial extension.

14. The apparatus of claim 1, wherein:

the decoupling element comprises a bellows; and a maximum elongation of the bellows is limited by the first and second frame elements.

15. The apparatus of claim 14, wherein:

the decoupling element comprises a bellows; and a maximum angle of a tilt of the bellows is limited by the first and second frame elements.

16. The apparatus of claim 1, wherein:

the decoupling element comprises a bellows; and a maximum angle of a tilt of the bellows is limited by the first and second frame elements.

17. An apparatus, comprising:

a connecting element configured to connect two components of the apparatus, the connecting element comprising first and second partial elements and a mechanical decoupling element between the first and second partial elements;

a first frame element;

a second frame element; and a stop, wherein:

the first and second frame elements connect the first and second partial elements;

the first and second frame elements are configured so that actuation of the decoupling element is limited by the stop;

the first frame element is U-shaped;

the second frame element is L-shaped;

a side of the L-shaped frame element is inside a recess defined by the U-shaped frame element; and the apparatus is a semiconductor lithography projection exposure apparatus.

18. An apparatus, comprising:

a connecting element configured to connect two components of the apparatus, the connecting element comprising first and second partial elements and a mechanical decoupling element between the first and second partial elements;

a first frame element;

a second frame element; and a stop, wherein:

the first and second frame elements connect the first and second partial elements;

the first and second frame elements are configured so that actuation of the decoupling element is limited by the stop;

the first and second frame elements are identical and comprise a hollow-cylindrical main body comprising axial extensions and radial extensions alternating around a circumferential side of the main body;

in each case, a radial extension and an axial extension lie opposite each other;

the axial extensions are aligned with the respective radial extension;

the radial extensions comprise a cutout through which a respective screw extends that is screwed at an end face into the opposite axial extension; and the apparatus is a semiconductor lithography projection exposure apparatus.

19. The apparatus of claim 18, wherein each of the first and second frame elements comprises an O-ring.

20. The apparatus of claim 18, wherein the decoupling element comprises a bellows, and each of the first and second frame elements comprises an O-ring.

* * * * *